United States Patent [19]

Cziep et al.

[11] Patent Number: 4,834,835

[45] Date of Patent: May 30, 1989

[54] PRODUCING VIAHOLES IN PLASTIC SHEETS AND APPLICATION OF THE METHOD

[75] Inventors: Werner Cziep, Altdorf, Fed. Rep. of Germany; Ulrich Kuenzel, San Jose, Calif.; Wolf-Dieter Ruh, Sindelfingen, Fed. Rep. of Germany

[73] Assignee: International Business Machines Corp., Armonk, N.Y.

[21] Appl. No.: 112,324

[22] Filed: Aug. 18, 1987

Related U.S. Application Data

[62] Division of Ser. No. 742,684, Jun. 10, 1985.

[30] Foreign Application Priority Data

Jul. 16, 1984 [EP] European Pat. Off. ........ 84108324.9

[51] Int. Cl.$^4$ ............................................. C23F 1/02
[52] U.S. Cl. ................................. 156/643; 156/644; 156/646; 156/659.1; 156/668; 156/902; 204/192.32; 204/192.36; 29/852
[58] Field of Search ............ 156/644, 643, 646, 659.1, 156/629, 634, 645, 656, 630, 668, 902; 428/901, 192, 131, 408, 339; 430/315, 313, 312; 204/192.36, 192.32; 29/852

[56] References Cited

U.S. PATENT DOCUMENTS

| | | |
|---|---|---|
| 3,099,608 | 7/1963 | Radovsky et al. |
| 3,778,900 | 12/1973 | Haining et al. |
| 4,012,307 | 3/1977 | Phillips |
| 4,247,600 | 1/1981 | Adachi |
| 4,367,119 | 1/1983 | Logan et al. |
| 4,447,824 | 5/1984 | Logan et al. |
| 4,597,828 | 7/1986 | Tadros |

OTHER PUBLICATIONS

Yeh, J. T. C., et al., "Magnetic field enhanced reactive ion etching of polyimide", J. Vac. Sci. Technol. A 2 (3), pp. 1292–1295, Jul.–Sep. 1984.
Eggitto, F. D., et al., Plasma etching of organic materials, I, Polyimide in 02–CF4, J. Vac. Sci. Technol. B3 (3), pp. 893–904, May/Jun. 1985.
Turban, G. and Rapequx, M., "Dry Etching of Polyimide in 02–CF4 and 02–SF4 Plasmas", J. Electrochem. Soc.: Solid–State Science and Technology, pp. 2231–2236, Nov. 1983.
Ting, C. H., et al., Semiconductor International, Feb. 1985.
Abstract No. 179 from 1046 Extended Abstracts, T. O. Herndon, W. J. Landoch, & R. O. Burke, entitled "Plasma Etching of Vias in Polyimide Using Nonerodible Masks", vol. 83-1, May 1983, p. 290, Pennington, NJ, USA.
Abstract of "Reaction Kinetic Processes at the Interface Between Nonisothermal Plasma and Solid", J. Freidrich, p. 397 of Catalysis, Kinetics, vol. 95, 1981, Berlin, Ger. Dem. Rep.

*Primary Examiner*—David L. Lacey
*Assistant Examiner*—Thi Dang
*Attorney, Agent, or Firm*—Pollock, Vande Sande & Priddy

[57] ABSTRACT

Viaholes are dry-etched into glass fiber reinforced plastic sheets according to a predetermined hole pattern, leaving the glass fiber meshing practically unaffected.

The method is used, for instance, to fabricate plastic sheets with unilaterally or bilaterally applied conductor patterns and viaconnectors that are conductively linked to the conductor patterns, and to fabricate multilayer board laminates obtained by several plastic sheets carrying the conductor pattern being alternately packaged, if required, with untreated copper sheets, and by the package thus obtained being subsequently laminated. Such boards and/or plastic sheets bilaterally provided with conductor patterns may be used as connector boards for, say, multilayer ceramic modules carrying semiconductor chips.

9 Claims, 1 Drawing Sheet

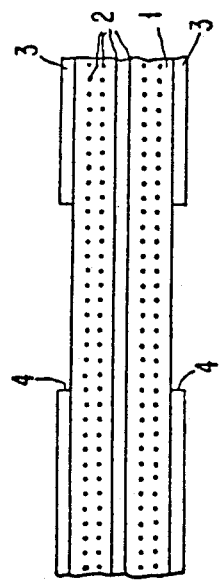
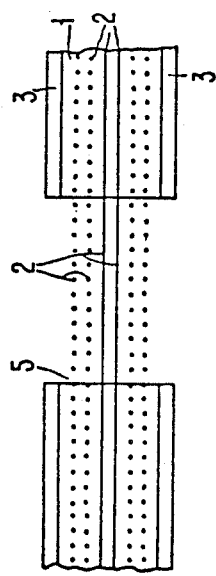
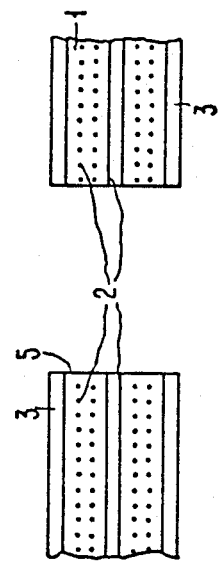
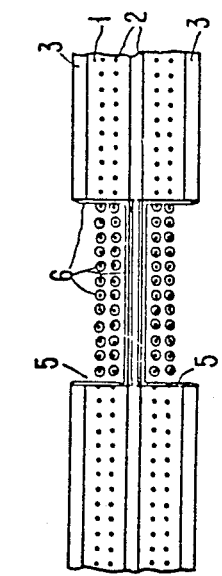
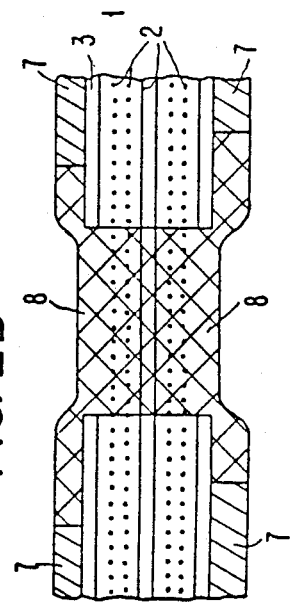

PRODUCING VIAHOLES IN PLASTIC SHEETS AND APPLICATION OF THE METHOD

This is a divisional of co-pending patent application Ser. No. 742,684, filed on June 10, 1985.

BACKGROUND OF THE INVENTION

The present invention concerns a method of producing viaholes in glass fiber reinforced plastic sheets and an application of that method for fabricating plastic sheets with unilaterally or bilaterally applied conductor patterns and viaconnectors conductively linked to the conductor patterns.

The method is used in particular to fabricate multilayer boards. Such boards are laminates of several glass fiber reinforced plastic sheets, to every other one of which a conductor pattern is unilaterally or bilaterally applied. The conductor patterns are conductively interconnected by copper layers on the walls of viaholes in the plastic sheets. The methods suitable for fabricating multilayer boards include, for instance, the so-called "pin-parallel method". This method is described in the article "High-density board fabrication techniques" by J. R. Bub et al published in the IBM Journal of Research and Development, Vol. 26, No. 3, May 1982, p. 306 and subsequent pages. By this method a copper layer is bilaterally applied to a plastic sheet. Subsequently, holes in accordance with the desired placement of the viaholes are drilled into the copper layers and the plastic sheet either mechanically or by a laser beam. The holes are cleaned and activated for electroless plating by means of a solution produced from $PdCl_2$ and $SnCl_2$. The two copper layers are subsequently covered with a photoresist mask, representing the negative of the desired conductor pattern, and finally copper is deposited in the holes and on the bared regions of the copper layers. Then the photoresist masks and the bared regions of the thin copper layer are removed. From the plastic sheets thus obtained a package is formed, alternately using untreated plastic sheets, and laminated. Finally, throughholes are drilled into the package and, after activation (see above) their walls are electrolessly copper-plated. During the formation of the holes with a diameter of about 0.25 mm in the about 0.15 mm thick and about 70×60 cm large sheets and also in particular during the cleaning of the holes, for example, by sandblasting, the plastic sheets are subjected to high thermal and/or mechanical stresses. The holes have a very small spacing, so that close tolerances have to be observed during drilling or laser beam treatment, which is difficult to accomplish by the tools described. Apart from this, the drilling or laser beam irradiation step is time-consuming and expensive from an apparatus point of view. Furthermore, the mechanical stability of the plastic sheets is greatly reduced during the formation of the holes, because the glass fiber meshing in the holes is removed in the same process. Finally, the conductive connectors in the holes formed by the described process fall short of the optimum values, since the copper coating is thin and not continuous throughout.

SUMMARY OF THE INVENTION

Therefore, it is an object of the present invention to provide a method, by means of which holes in glass fiber reinforced plastic sheets can be rapidly, gently and inexpensively formed with tight tolerances, and an application of that method during the fabrication of plastic sheets with unilaterally or bilaterally applied conductor patterns and viaconnectors.

This and other objects of the present invention are accomplished by means of a method of fabricating a pattern of viaholes in glass fiber reinforced plastic sheets comprising the step of dry-etching the viaholes, attacking only the plastic but not the glass fiber meshing. An application of this method for fabricating a pattern of viaholes in a glass fiber reinforced plastic sheets with unilaterally or bilaterally applied conductor patterns and via connectors that are conductively linked to the conductor patterns, comprises etching holes into a glass fiber reinforced plastic sheet unilaterally or bilaterally provided with a copper mask. Then, the walls of the holes and the glass fiber meshing are activated with a solution containing colloidal palladium. Next, photoresist masks, representing the negatives of the desired conductor patterns, are generated on the copper masks and copper is electrolessly deposited on the bared regions of the copper mask(s), the activated walls of the holes and the activated glass fiber meshing. Finally, the photoresist mask and the subjacent regions of the copper mask(s) are removed.

Although the glass fiber meshing is practically not attacked during dry etching, the plastic material in the region of the holes is removed so cleanly that subsequent cleaning of the holes is not required. In contrast to known methods, the method in accordance with the invention ensures that all of the holes to be formed in a plastic sheet—an about 70×60 cm sheet has some 4000 holes—are simultaneously etched. There are already dry etching devices on the market that permit several such plastic sheets to be simultaneously etched. As these dry etching devices are less expensive than those used for drilling or laser beam irradiation and also afford a higher throughput, the method according to the invention is far more economical than known ones. In addition, it permits etching with very small tolerances, so that holes with a diameter of less than 0.25 mm can be produced with a high surface density. As the method according to the invention does not subject the plastic sheets to mechanical stress during or after etching, because, in contrast to known methods, a cleaning step is not necessary after the holes have been formed, it is also possible to etch very thin plastic sheets without any distortions. An additional advantage is that the glass fiber meshing remains unaffected during the formation of the holes, so that there is practically no deterioration of the mechanical stability of the plastic sheets when the holes are formed.

It is advantageous to generate the holes by plasma etching in an atmosphere containing $CF_4$ and $O_2$. For that purpose, it is favourable to etch at an HF power of between about 3 and about 6 kW and a pressure of between about 0.1 and 1 mbar, using a gas flow of 5 standard liters per minute (SLM), in which the proportion of $CF_4$ ranges from about 25 to about 45 and the proportion of $O_2$ from about 75 to about 55 volume percent.

Therefore, the method according to the invention is particularly suitable for the fabrication of plastic sheets with unilaterally or bilaterally applied conductor patterns and viaconnectors, since its advantages favourably influence the efficiency, accuracy and reproducibility of the fabrication process. The method according to the invention has the particular advantage that it does not remove the glass fiber meshing in the holes. As during the treatment with the solution containing palladium and tin chloride the glass fiber meshing is also activated, copper plating causes copper to be deposited on the hole walls as well as on the glass fiber meshing, so that the entire hole is practically filled with copper. As a result, the mechanical stability of the plastic sheet is further increased, the conductivity of the viaconnectors is improved over that afforded by known methods, and the surface in the area of the holes is practically coplanar with the surface of the plastic sheet, which has the favourable effect that when several such plastic sheets are laminated, they are positioned flatly and practically failure-free on top of each other.

BRIEF DESCRIPTION OF THE DRAWING

Other advantageous embodiments of the method according to the invention and its application may be seen from the following detailed description in conjunction with the accompanying drawing, in which:

FIG. 1 is a schematic cross-sectional view of a structure that is assumed as a basis for the method according to the invention, FIG. 2A is a schematic cross-sectional view of a structure obtained by the method according to the invention, FIG. 2B is a schematic cross-sectional view of the structure obtained by prior art methods after the viaholes have been produced, and FIGS. 3 and 4 are also cross-sectional views of the result of two method steps during the further treatment of a structure produced according to the invention.

DESCRIPTION OF THE PREFERRED EMBODIMENT

The method in accordance with the invention is described in detail below with reference to FIGS. 1 and 2A. As described, it is implemented such that conductor patterns are generated on either side of the plastic sheet, and the applications described also proceed from such plastic sheets. It is pointed out that the method according to the invention also works with unilaterally applied or no conductor patterns, although in the latter case it should be difficult to find a suitable application in practice.

It is assumed that there is a plastic sheet 1 which is reinforced with a glass fiber meshing 2, consisting of a polymer, such as an epoxy resin, and which is, for example, 70×60 cm large and 0.1 to 0.2 mm thick. The epoxy resin used may be, for instance, an epoxy resin such as that marketed by Ciba-Geigy under the trade name of Araldid 9302. The glass fiber meshing consists of a glass that is poor in alkali. To either side of the plastic sheet 1, a thin layer 3 of a mask material, say, copper, is applied. For that purpose, a strippable foil, which essentially consists of a 5 m and a 70 m thick copper foil, is laminated to the plastic sheet such that the thinner copper foil, which, in addition, has a rough surface, is laminated to the two surfaces of the plastic sheet. Subsequently, a hole pattern 4, corresponding to the desired viahole pattern in the plastic sheet, is photolithographically generated either in only one or both mask layers 3. This may be done, for example, by applying a photoresist foil to both sides of the mask layers 3 and by subsequently unilaterally or bilaterally irradiating and developing the foil to obtain an image suiting the desired conductor pattern. The photoresist foil used may be a foil such as that marketed by DuPont under the trade name of Riston. If Riston is used, 1,1,1-trichloroethane is employed for the development step. The bared regions of the mask layer 3 are then removed. If the mask layer 3 is made of copper, this is etched off, for example, by an ammoniacal $CuCl_2$ or a sulfuric acidic sodium peroxodisulfate solution. Then the photoresist is removed, for which purpose, in the case of Riston, methylene chloride is best used. A cross-sectional view of the structure existing at that stage is shown in FIG. 1 which assumes that the hole pattern 4 is generated bilaterally. At a size of the plastic sheet of 70×60 cm and a hole diameter of about 0.25 mm, the hole pattern 4 consists of 4000 holes.

In the subsequent method step, holes 5 in the regions of the plastic sheet 1 not covered by the mask layer(s) are dry-etched either from only one—as shown in FIG. 2A—or from both surfaces. For dry etching, a plasma etch process is preferably used which is implemented in an atmosphere containing $CF_4$ and $O_2$ as reactive gases.

For plasma etching, devices are generally used wherein the workpiece to be etched is located in an evacuated chamber between a cathode-anode electrode pair, with the cathode being connected to high-frequency, the anode to ground potential, and the workpiece to a varying potential. The reactive gas is directed through the chamber. The etch effect of plasma etching is predominantly chemical. In the plasma produced in the reactive gas between the electrodes reactive ions are generated which form volatile reaction products with the material of the plastic sheet, thus causing same to be removed. Compared with this chemical effect of the ions, a removal resulting from their kinetic energy is scarcely of any significance. For plasma etching, a system may be used in which the electrodes are aligned parallel to each other and which is marketed by Branson under the type number 7411. This system comprises ten cells, each of which is surrounded by one cathode-anode pair, and in which one plastic sheet measuring 70×60 cm is processed at a time. That means that ten plastic sheets of that size can be simultaneously etched. During etching, the plastic sheets are supported in aluminium stands between the electrodes. The stands and thus the plastic sheets are electrically insulated from the high-frequency voltage and ground potential. By means of a pump, the etching gas is pumped through the cells at a maximum speed of 900 $m^3$ per hour.

For etching the viaholes in the plastic sheets, a high-frequency of between about 3 and about 6 kW (13.56 MHz), a pressure of between about 0.1 and 1 mbar, and a total gas flow of between 3 and 7 standard liters per minute are used, with the proportion of $CF_4$ in the gas ranging from about 25 to about 45 and the proportion of $O_2$ ranging from about 75 to about 55 volume percent. During the implementation of the method, the glass fiber meshing is practically not attacked, while the epoxy is removed without residues or deposits. The schematic cross-sectional view in FIG. 2A shows the structure after dry etching. Etching leads to the formation of the viaholes 5 in which the glass fiber meshing 2 still exists in its entirety.

The schematic cross-sectional view of FIG. 2B serves to illustrate what becomes of the structure in FIG. 1 if the known methods of forming the viaholes, i.e., drilling or laser beam irradiation, are applied. The main difference between that structure and the one shown in FIG. 2A is that there is no glass fiber meshing 2 left in the hole 5 shown in FIG. 2B.

Subsequently, the method according to the invention will be described still further with reference to two examples. In both examples, about 4000 holes with a diameter of 0.25 mm were etched in a Branson system into five expoxy resin sheets with a size of 70×60 cm and a thickness of 0.15 mm. The conditions were as follows:
high-frequency power: 4 kW
frequency: 13.56 MHz
pressure: 0.6 mbar
total gas flow: 5 SLPM
CF$_4$ content in gas 35 volume percent
O$_2$ content in gas, 65 volume percent In both examples, a 5 m thick copper foil was bilaterally laminated to the plastic sheets. The examples differed in that in the event of example 1, only one of the copper foils was provided with a hole pattern according to the desired viahole pattern, whereas in the event of example 2, both copper foils of the sheets used were provided with such a pattern. Under the described conditions, the etching speed for the expoxy was about 2.5 m per minute. In the event of example 1, the etching time was about 65 minutes and in the event of example 2 about 32 minutes. It was found that the glass fiber meshing remains practically unaffected by the etch process. The tolerances of the dimensions of all holes etched in either example were small. Even in the event of example 1, where etching was effected from only one surface of the plastic sheet, the epoxy resin was satisfactorily etched to the opposite copper foil. No particulate or greasy deposits were found in the etched holes.

The method in accordance with the invention may be advantageously combined with the method of fabricating plastic sheets with unilaterally or bilaterally applied conductor patterns and viaconnectors that are conductively linked to the conductor patterns. The sheets thus fabricated are used either in that form or, for example, after a package has been formed of several of them and, if required, of interposed untreated plastic sheets, and the package thus obtained has been laminated and provided with throughholes, as an electrical carrier for ceramic modules to which semiconductor chips with integrated circuits are soldered. A prerequisite for applying the method in accordance with the invention in that way is that it is possible to produce connectors with a good conductivity in the holes formed by it. That prerequisite is not only met by the method in accordance with the invention but the result achieved by it is superior to that of known methods. While with known methods the holes formed have to be cleaned first before they can be activated for copper plating, such cleaning is eliminated with the new method, and during activation with a palladium/tin chloride solution (the finished solution containing colloidal zerovalent palladium), the method according to the invention, unlike known methods where there is no glass fiber material left in the holes, causes the hole wall and the glass fiber meshing to be activated. As a result, during the subsequent electroless deposition step, copper is deposited both on the hole walls and the glass fiber meshing, thus ensuring—as previously described—not only an improved electrical connection but also an increase in mechanical stability.

The entire process of fabricating plastic sheets with bilaterally applied conductor patterns and conductive connectors for linking the conductor pattern, utilizing the method according to the invention, is preferably carried out in the manner described by way of FIGS. 1, 2A, 3 and 4:

1. To an about 70×60 cm and 0.15 cm thick copper sheet 1 of glass fiber reinforced epoxy resin a strippable foil consisting of a thicker (70 m) and a thinner (5 m) foil is bilaterally laminated such that the surface of the thinner copper foil, which is relatively rough, rests against the plastic surface. The thin copper foil serves as a mask layer 3.

2. The thicker copper foil is stripped from either side.

3. This is followed by the method according to the invention, as has previously been described in detail. That means that first of all the hole pattern 4 is photolithographically generated in the 5 m thick copper foils 3 (the resultant structure being shown in the schematic cross-sectional view of FIG. 1) and that the viaholes 5 are subsequently plasma-etched, using the copper foils 3 as etch masks. The resultant structure is shown in FIG. 2A.

4. The walls of the viaholes 5 and the bared glass fiber meshing 2 are then activated for electroless copper plating in a solution obtained by dissolving palladium and tin chloride in a diluted hydrochloric acid solution and containing colloidal zerovalent palladium. The resultant structure is shown in the schematic cross-sectional view of FIG. 3, reference number 6 denoting the activation applied.

5. A photoresist foil consisting, for example, of Riston, is then applied to either side of the copper foils 3. Subsequently, a hole pattern corresponding to the desired conductor pattern and in which the viaholes 5 have been bared is formed by imagewise exposure and developed with 1,1,1-trichloro ethane.

6. On to the bared regions of the copper foil 3 and the activated regions in the viaholes 5 copper is electrolessly deposited by immersion in an alkaline solution containing copper sulfate, EDTA dianhydride, a wetting agent, formaldehyde and a small amount of sodium cyanide. A section of the resultant structure is shown in the cross-sectional view in FIG. 4, the photoresist mask being designated as 7 and the deposited copper as 8.

7. In the last method step, the photoresist mask 7 is removed by methylene chloride, thus completing the plastic sheet with bilaterally applied conductor patterns and viaconnectors for connecting the conductor patterns.

If a board with several levels of conductor patterns is to be fabricated, the process has to be continued.

8. Several sheets fabricated in method steps 1 to 7 are alternately packaged with suitably aligned untreated plastic sheets of the same size and about the same thickness and laminated. Then throughholes are drilled through the package, and subsequently the hole walls are activated and electrolessly copper-plated.

Boards thus fabricated generally have a thickness of 5 mm and the number of plastic sheets with bilaterally applied conductor patterns they comprise is of the order of 15. These boards may be provided with multilayer ceramic modules comprising a corresponding number of conductor planes and to each of which a large number of semiconductor chips with large-scale integrated densely packed integrated circuits is soldered.

Of course, the foregoing description is directed to one particular embodiment of the present invention and various modifications and other embodiments of the present invention will be readily apparent to one of ordinary skill in the art to which the present invention pertains. Therefore, while the present invention has been described in conjunction with a particular embodiment, it is to be understood that various modifications and other embodiments of the present invention may be made without departing from the scope of the present invention as described herein and as claimed in the appended claims.

What is claimed is:

1. A method for fabricating glass fiber reinforced plastic sheets with applied conductor patterns and via connectors that are conductively linked to the conductor patterns comprising the steps of:
   providing a copper mask on a glass fiber reinforced plastic sheet;
   dry-etching holes into said glass fiber reinforced plastic sheet with said copper mask while leaving the glass fiber in the holes substantially unaffected;
   activating the walls of the holes and glass fiber in the holes with a composition containing palladium;
   generating a photoresist mask, representing the negative of a desired conductor patterns, on the copper mask so as to leave exposed regions of the copper mask;
   electrolessly depositing copper on the exposed regions of the copper mask, the walls of the holes that have been activated, and the glass fiber that has been activated;
   and removing the photoresist mask and regions of the copper mask lying directly beneath the photoresist mask.

2. The method of claim 1 wherein said copper mask is unilaterally applied.

3. The method of claim 1 wherein said copper mask is bilaterally applied.

4. The method of claim 1 which further comprises providing an assembly of a plurality of said glass fiber reinforced plastic sheets with applied conductor patterns wherein on some of said plastic sheets the conductor patterns are unilaterally applied, and on some others of said plastic sheets the conductor patterns are bilaterally applied; and arranging said assembly so that said plastic sheets with unilaterally applied conductor patterns are packaged in alternating order with bilaterally applied conductor patterns;
   laminating together the plastic sheets of the assembly;
   drilling through-holes through the assembly after said laminating;
   cleaning the walls of the through-holes after said drilling;
   activating the walls of said through-holes for subsequent electroless plating thereon;
   and electrolessly plating said through-holes with copper.

5. A method according to claim 1 wherein the step of dry-etching comprises:
   plasma etching the viaholes in an atmosphere containing $CF_4$ and $O_2$.

6. A method according to claim 5 wherein the plasma etching is effected at an HF power of between 3 and about 6 kW and a pressure of between about 0.1 and about 1 mbar using a gas flow of between about 3 and about 7 standard liters per minute with the gas mixture containing between about 25 and 45 volume percent $CF_4$ and between about 75 and about 55 volume percent $O_2$.

7. A method according to claim 5 wherein the plasma etching is effected at an HF power of about 4 kW and a pressure of about 0.6 mbar using a gas flow of about 5 standard liters per minute with the gas mixture containing about 35 volume percent $CF_4$ and about 65 volume percent $O_2$.

8. A method according to claim 1 wherein the dry-etching effected from one or simultaneously both surfaces of the plastic sheet.

9. A method according to claim 1 wherein the plastic sheet which is etched comprises an epoxy resin.

* * * * *